(12) United States Patent
Mitsui et al.

(10) Patent No.: US 7,262,065 B2
(45) Date of Patent: Aug. 28, 2007

(54) FERROELECTRIC MEMORY AND ITS MANUFACTURING METHOD

(75) Inventors: Hiroyuki Mitsui, Mie (JP); Katsuo Takano, Nagano (JP); Shinichi Fukada, Tokyo (JP); Hiroshi Matsuki, Nagano (JP)

(73) Assignee: Seiko Epson Corporation (JP)

( * ) Notice: Subject to any disclaimer, the term of this patent is extended or adjusted under 35 U.S.C. 154(b) by 90 days.

(21) Appl. No.: 11/226,728

(22) Filed: Sep. 14, 2005

(65) Prior Publication Data

US 2006/0099722 A1  May 11, 2006

(30) Foreign Application Priority Data

Nov. 5, 2004  (JP) .............................. 2004-322489

(51) Int. Cl.
*H01L 21/00* (2006.01)
*H01L 29/76* (2006.01)
*H01L 29/94* (2006.01)
*H01L 31/00* (2006.01)

(52) U.S. Cl. .................. 438/3; 257/295; 257/E21.664; 257/E27.104

(58) Field of Classification Search ............... 257/295, 257/E21.664, E27.104; 438/3
See application file for complete search history.

(56) References Cited

U.S. PATENT DOCUMENTS

| | | | |
|---|---|---|---|
| 4,252,421 A | 2/1981 | Foley, Jr. .................... | 351/162 |
| 6,841,396 B2* | 1/2005 | Celii et al. ...................... | 438/3 |
| 2003/0119211 A1* | 6/2003 | Summerfelt et al. ........... | 438/3 |
| 2004/0042134 A1* | 3/2004 | Kim et al. ..................... | 361/15 |
| 2004/0166629 A1* | 8/2004 | Hilliger et al. ............. | 438/253 |
| 2004/0191930 A1* | 9/2004 | Son et al. ...................... | 438/3 |
| 2005/0181605 A1* | 8/2005 | Ozaki et al. ................ | 438/673 |

FOREIGN PATENT DOCUMENTS

| | | |
|---|---|---|
| JP | 2002-033459 | 1/2002 |
| JP | 2004-335536 | 11/2004 |

* cited by examiner

*Primary Examiner*—B. William Baumeister
*Assistant Examiner*—Igwe U. Anya
(74) *Attorney, Agent, or Firm*—Harness, Dickey & Pierce, P.L.C.

(57) ABSTRACT

A method for manufacturing a ferroelectric memory includes: (a) forming first and second contact sections on a first dielectric layer formed above a base substrate; (b) forming a laminated body having a lower electrode, a ferroelectric layer and an upper electrode successively laminated; (c) forming a conductive hard mask above the laminated body and etching an area of the laminated body exposed through the hard mask, to thereby form a ferroelectric capacitor above the first contact section; (d) forming above the first dielectric layer a second dielectric layer that covers the hard mask, the ferroelectric capacitor and the second contact section; (e) forming a contact hole in the second dielectric layer which exposes the second contact section; (f) providing a conductive layer in an area including the contact hole for forming a third contact section; and (g) polishing the conductive layer and the second dielectric layer until the hard mask above the ferroelectric capacitor is exposed.

13 Claims, 3 Drawing Sheets

FERROELECTRIC MEMORY AND ITS MANUFACTURING METHOD

RELATED APPLICATIONS

This application claims priority to Japanese Patent Application No. 2004-322489 filed Nov. 5, 2004 which is hereby expressly incorporated by reference herein in its entirety.

BACKGROUND

1. Technical Field

The present invention relates to ferroelectric memories and methods for manufacturing the same.

2. Related Art

In many occasions, a contact section composed of tungsten is formed over a ferroelectric capacitor, and it is electrically connected to an Al wiring pattern above. In this case, because tungsten is processed in a hydrogen atmosphere, hydrogen may penetrate the ferroelectric capacitor through a contact hole above, whereby characteristics of the ferroelectric capacitor may be deteriorated. In particular, when miniaturization of ferroelectric capacitors is advanced, the influence of hydrogen in the process of forming contact sections composed of tungsten or the like cannot be ignored. As a remedy, for example, an upper electrode of a ferroelectric capacitor may be thickly formed, to thereby improve the hydrogen barrier effect. However, when upper electrodes are made thick, etching for ferroelectric capacitors becomes complicated, and manufacture thereof that complies with miniaturization becomes difficult.

It is an object of the present invention to prevent deterioration of the characteristics of ferroelectric capacitors, and to provide ferroelectric memories that can realize further miniaturization and more layers, and methods for manufacturing the same.

SUMMARY (1) A method for manufacturing a ferroelectric memory in accordance with the present invention includes:

(a) forming first and second contact sections on a first dielectric layer formed above a base substrate;

(b) forming a laminated body having a lower electrode, a ferroelectric layer and an upper electrode successively laminated;

(c) forming a conductive hard mask above the laminated body and etching an area of the laminated body exposed through the hard mask, to thereby form a ferroelectric capacitor above the first contact section;

(d) forming above the first dielectric layer a second dielectric layer that covers the hard mask, the ferroelectric capacitor and the second contact section;

(e) forming a contact hole in the second dielectric layer which exposes the second contact section;

(f) providing a conductive layer in an area including the contact hole for forming a third contact section; and (g) polishing the conductive layer and the second dielectric layer until the hard mask above the ferroelectric capacitor is exposed.

According to the present invention, when a processing with hydrogen is conducted in the step of forming the third contact section, the ferroelectric capacitor is in a state covered by the second dielectric layer, such that reduction of the ferroelectric capacitor by hydrogen can be prevented, and deterioration of its characteristics can be prevented. Also, for example, the upper electrode does not need to be formed thick enough to the extent of achieving a hydrogen barrier effect, and therefore a method for manufacturing a ferroelectric capacitor that complies with its miniaturization can be realized without concern about the influence of hydrogen. Also, because the hard mask over the ferroelectric capacitor is exposed by polishing, the flatness of the electrical connection section that is formed over the ferroelectric capacitor can be secured, and therefore a manufacturing method that complies with multilayering can be realized. Furthermore, the upper electrode of the ferroelectric capacitor is not polished, and in this respect, deterioration of the characteristics of the ferroelectric capacitor can be prevented.

It is noted that, in the present invention, the case where a layer B is provided above a specific layer A includes a case where the layer B is directly provided on the layer A, and a case where the layer B is provided above the layer A through another layer. This similarly applies to the inventions to be described below.

(2) In the method for manufacturing a ferroelectric memory, in the step (g), a portion of the hard mask may be removed.

(3) In the method for manufacturing a ferroelectric memory, in the step (g), the polishing may be conducted by using a CMP (Chemical Mechanical Polishing) method.

The method for manufacturing a ferroelectric memory may further include, after the step (g), forming an electrical connection section above the hard mask.

(5) In the method for manufacturing a ferroelectric memory, the electrical connection section may be formed as a contact section.

(6) In the method for manufacturing a ferroelectric memory, the electrical connection section may be formed as a wiring pattern.

(7) The method for manufacturing a ferroelectric memory may further include, after the step (g), forming another electrical connection section above the third contact section.

(8) In the method for manufacturing a ferroelectric memory, the hard mask may include a TiAlN layer.

(9) The method for manufacturing a ferroelectric memory may further include, after the step (c), forming a hydrogen barrier layer that covers at least the hard mask and the ferroelectric capacitor.

(10) A ferroelectric memory in accordance with the present invention includes:

a base substrate;

a first dielectric layer formed above the base substrate;

first and second contact sections on the first dielectric layer;

a ferroelectric capacitor formed from a lower electrode, a ferroelectric layer and an upper electrode successively laminated above the first contact section;

a conductive hard mask formed above the ferroelectric capacitor;

a second dielectric layer that is formed above the first dielectric layer, and has an upper surface that is generally at an identical height with an upper surface of the hard mask above the ferroelectric capacitor;

a third contact section formed on the second dielectric layer and positioned above the second contact section; and an electrical connection section formed above the hard mask.

According to the present invention, the flatness of the electrical connection section that is formed on the ferroelectric capacitor can be secured, such that a ferroelectric memory that complies with miniaturization and multilayering can be provided.

(11) In the ferroelectric capacitor, an upper surface of the third contact section may be positioned generally at an identical height with the upper surface of the hard mask above the ferroelectric capacitor.

DETAILED DESCRIPTION

Embodiments of the present invention are described below with reference to the accompanying drawings.

FIG. 1 through FIG. 10 are views schematically showing a method for manufacturing a ferroelectric memory in accordance with an embodiment of the present invention.

Figure 1:
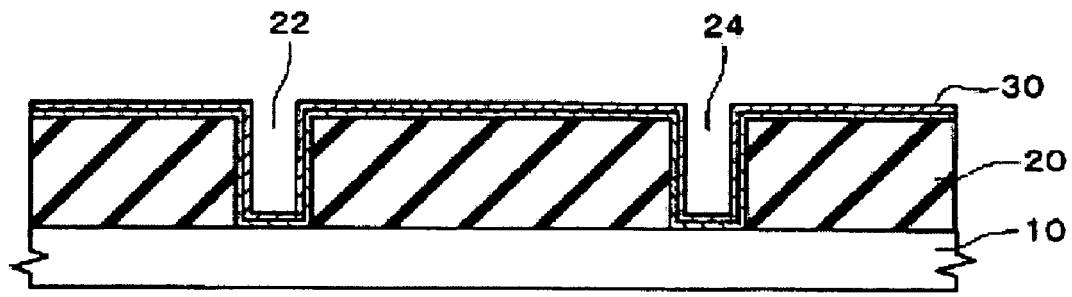
FIG. 1 is a view showing a method for manufacturing a ferroelectric memory in accordance with an embodiment of the present invention.
Figure 2:
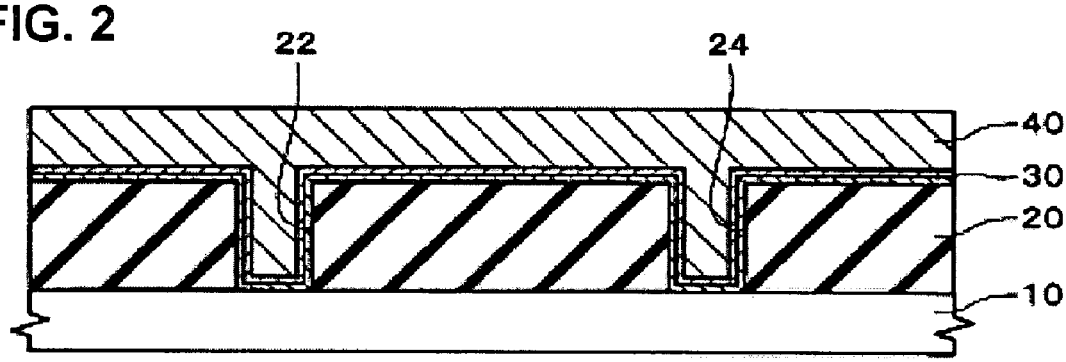
FIG. 2 is a view showing the method for manufacturing a ferroelectric memory in accordance with the embodiment of the present invention.
Figure 3:
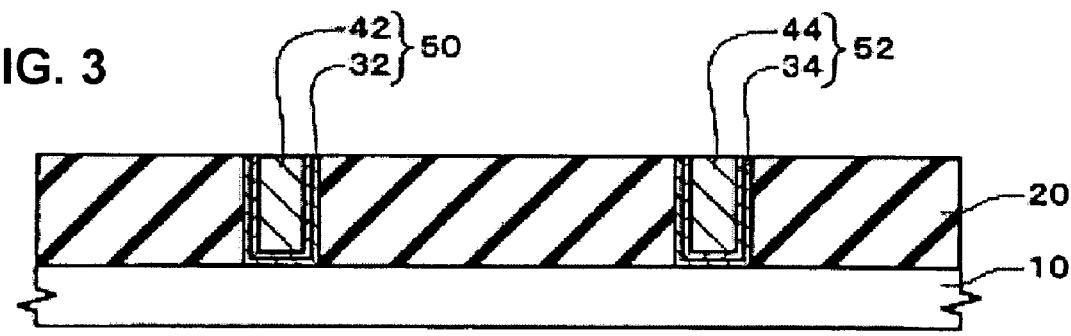
FIG. 3 is a view showing the method for manufacturing a ferroelectric memory in accordance with the embodiment of the present invention.

First, as shown in FIG. 1-FIG. 3, first and second contact sections 50 and 52 are formed in a first dielectric layer 20 on a base substrate 10.

The base substrate 10 is a semiconductor substrate (for example a silicon substrate). A plurality of transistors (not shown) are formed on the base substrate 10. Each transistor includes an impurity region that becomes to be a source region or a drain region, a gate dielectric layer and a gate electrode. Element isolation regions (not shown) are formed between the transistors, to thereby electrically insulate the transistors from one another. In the present embodiment, a ferroelectric memory having a 1T1C type stacked structure is manufactured as one example.

As shown in FIG. 1, the first dielectric layer 20 is formed on the base substrate 10. When the base substrate 10 is a silicon substrate, the first dielectric layer 20 may be formed from a silicon oxide layer. As the first dielectric layer 20, an oxide layer, such as, for example, BPSG (boro-phospho SG), NSG (non-doped SG) or PTEOS (plasma TEOS) may be formed to a thickness of, for example, 1.0 μm or greater. The first dielectric layer 20 is formed over a surface where the plural transistors are formed on the base substrate 10. The first dielectric layer 20 may be formed in a manner to cover the entire upper surface of the base substrate 10, and may be formed by using a known technology, such as, for example, a CVD (Chemical Vapor Deposition) method. It is noted that the first dielectric layer 20 may be polished by using a planarization technique such as a CMP (Chemical Mechanical Polishing) method or the like.

Next, first and second contact holes 22 and 24 are formed in the first dielectric layer 20. The first and second contact holes 22 and 24 are formed at mutually different positions in a plane of the first dielectric layer 20. Source regions or drain regions of transistors are exposed through the first and second contact holes 22 and 24, respectively. The first and second contact holes 22 and 24 can be formed through combining a photolithography technique and a dry etching technique.

In the example shown in FIG. 1, barrier layers 30 are formed on inner surfaces of the first and second contact holes 22 and 24, respectively. The barrier layers 30 are provided to prevent diffusion at contact sections. Alternatively, adhesion between contact sections and the dielectric layer can be improved by the barrier layers 30. The barrier layers 30 can be formed by sputtering or the like. The barrier layers 30 are formed on side surfaces (end faces of the first dielectric layer 20) and bottom surfaces (upper surface of the base substrate 10) of the first and second contact holes 22 and 24, respectively, and also formed on an upper surface of the first dielectric layer 20. However, the barrier layers 30 are formed in a manner not to embed the first and second contact holes 22 and 24. The barrier layer 30 can be formed from at least one of a Ti layer and a TiN layer, and may be formed in a single layer or multiple layers.

Next, as shown in FIG. 2, a first conductive layer 40 is formed inside the first and second contact holes 22 and 24 and on the first dielectric layer 20. The first conductive layer 40 is formed in a manner to embed the interiors of the first and second contact holes 22 and 24 (more specifically, the interiors surrounded by the barrier layers 30). When the barrier layer 30 is formed, the first conductive layer 40 is formed on the barrier layer 30. The first conductive layer 40 may be formed by a CVD method or the like. The first conductive layer 40 may be formed from, for example, a tungsten layer (W layer).

Then, as shown in FIG. 3, by polishing the first conductive layer 40, first and second contact sections 50 and 52 are formed. In the polishing step, the working surface is polished flat. The polishing may be conducted by using a CMP method. In the example shown in FIG. 3, a portion of the first conductive layer 40 and a portion of the barrier layer 30 are polished and removed. In other words, the first conductive layer 40 (and the barrier layer 30) is polished until the first dielectric layer 20 is exposed. The first contact section 50 includes a barrier layer 32 formed along the inner surface of the first contact hole 22 and a conductive section 42 that is formed on the interior surrounded by the barrier layer 32. The second contact section 52 includes a barrier layer 34 formed along the inner surface of the second contact hole 24 and a conductive section 44 that is formed on the interior surrounded by the barrier layer 34. It is noted that the first and second contact sections 50 and 52 are electrically connected to any of the transistors formed inside the base substrate 10.

Figure 4:
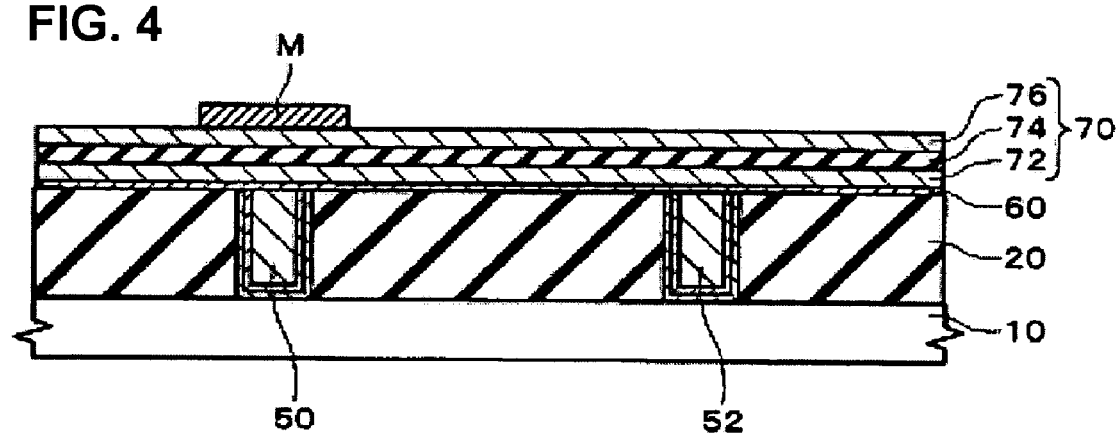
FIG. 4 is a view showing the method for manufacturing a ferroelectric memory in accordance with the embodiment of the present invention.
Figure 5:
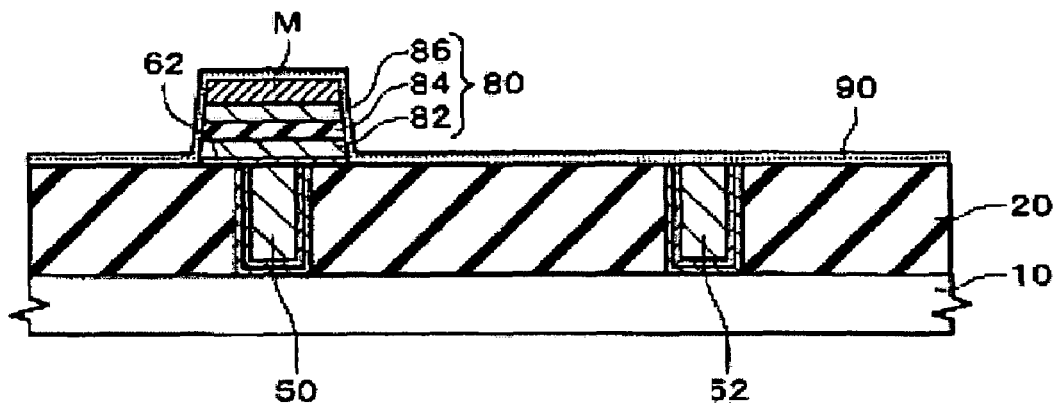
FIG. 5 is a view showing the method for manufacturing a ferroelectric memory in accordance with the embodiment of the present invention.

As shown in FIG. 4 and FIG. 5, a ferroelectric capacitor 80 is formed on the first contact section 50. The ferroelectric capacitor 80 can be formed on the first contact section 50 and on its surrounding area (on the dielectric layer 20). The ferroelectric capacitor 80 is not formed on the second contact section 52.

First, as shown in FIG. 4, a laminated body 70 having a lower electrode 72, a ferroelectric layer 74 and an upper electrode 76 successively laminated is formed on the first dielectric layer 20. The laminated body 70 is formed, for example, in an area that includes the first and second contact sections 50 and 52. Also, before the step of forming the laminated body 70, a barrier layer 60 may be formed at least on the first contact section 50. The barrier layer 60 has conductivity, and may be formed from, for example, a TiAlN layer. The barrier layer 60 can prevent oxidation of the first contact section 50, and improve adhesion of the same to the ferroelectric capacitor 80.

The method for forming the laminated body 70 is described in detail.

The lower electrode 72 may be formed from, for example, Pt, Ir, Ir oxide ($IrO_x$), Ru, Ru oxide ($RuO_x$), SrRu compound oxide ($SrRuO_x$) or the like. The lower electrode 72 may be formed in a single layer or multiple layers. As the method for forming the lower electrode 72, a sputtering method, a vacuum vapor deposition method, a CVD method or the like can be used.

The ferroelectric layer 74 may be formed with a PZT system ferroelectric composed of oxides including Pb, Zr and Ti as constituent elements. Alternatively, Pb (Zr, Ti, Nb) $O_3$ (PZTN system) in which Nb is doped in the Ti site may be applied. Alternatively, the ferroelectric layer 74 is not limited to these materials, but for example, any of a SBT system, a BST system, a BIT system and a BLT system may be applied. As the method for forming the ferroelectric layer 74, a solution coating method (including a sol-gel method, a MOD (Metal Organic Decomposition) method or the like), a sputter method, a CVD (Chemical Vapor Deposition) method, a MOCVD (Metal Organic Chemical Vapor Deposition) method or the like can be applied. It is noted that the ferroelectric layer 74, after having been formed to a desired thickness, is heated in an oxygen atmosphere for crystallization in a range between 500° C. and 700° C. for several minutes to several hours.

The upper electrode 74 may be formed through using materials and methods similar to those used for the lower electrode 72. The lower electrode 72 and the upper electrode 76 are not limited to any specific combinations, but for example, an Ir layer may be used as the lower electrode 72, and an $IrO_x$ layer may be used as the upper electrode 76. It is noted that an anneal treatment may be conducted depending on the requirements, after the upper electrode 76 has been formed.

Next, the laminated body 70 is patterned. When the barrier layer 60 is formed between the first dielectric layer 20 and the laminated body 70, the laminated body 70 and the barrier layer 60 may be patterned in a batch.

For patterning the laminated body 70, a hard mask M is used. More specifically, the hard mask M is formed on the laminated body 70, and areas of the laminated body 70 exposed through the hard mask M are etched, whereby a ferroelectric capacitor 80 is formed. The plane configuration of the hard mask M concurs with the plane configuration of the ferroelectric capacitor 80. The hard mask M itself may be patterned by using a photolithography technique and an etching technique. The hard mask M may be formed in a single layer or multiple layers, and has conductivity. The hard mask M includes a conductive layer, such as, for example, a TiAlN layer, a TiN layer or the like. When a TiAlN layer is used, because of its excellent oxidation resisting property, the hard mask M can be prevented from being oxidized even when an anneal treatment is conducted on the ferroelectric capacitor 80. For this reason, even when the hard mask M is remained, as described below, its conductivity can be sufficiently secured. The hard mask M may be formed to a thickness of, for example, about several thousand Angstroms. The hard mask M can be more easily controlled in its thickness than the upper electrode 86 of the ferroelectric capacitor 80. By using the hard mask M, patterning that complies with miniaturization of the ferroelectric capacitor 80 can be conducted.

In this manner, as shown in FIG. 5, the ferroelectric capacitor 80 can be formed. The ferroelectric capacitor 80 includes a lower electrode 82, a ferroelectric layer 84 and an upper electrode 86. A barrier layer 62 is formed between the ferroelectric capacitor 80 and a first contact section 50. The barrier layer 62 has the same plane configuration as that of the lower electrode 82 of the ferroelectric capacitor 80. Also, a hard mask M is provided on the ferroelectric capacitor 80. In the present embodiment, the hard mask M is left remained without being removed. It is noted that an anneal treatment may be conducted if necessary after the ferroelectric capacitor 80 has been patterned.

Also, in order to prevent the ferroelectric capacitor 80 from being deteriorated by the influence of hydrogen after the ferroelectric capacitor 80 has been formed, a hydrogen barrier layer 90 that covers at least the hard mask M and the ferroelectric capacitor 80 is formed. The hydrogen barrier layer 90 may be formed from an inorganic material layer (for example, an aluminum oxide layer ($AlO_x$ layer)). The hydrogen barrier layer 90 may be formed to cover not only the hard mask M and the ferroelectric capacitor 80, but also the first dielectric layer 20 and the contact section 52. It is noted that the hydrogen barrier layer 90 may be formed by a sputtering method or a CVD method to a thickness, for example, of about several hundred Angstroms.

Figure 6:
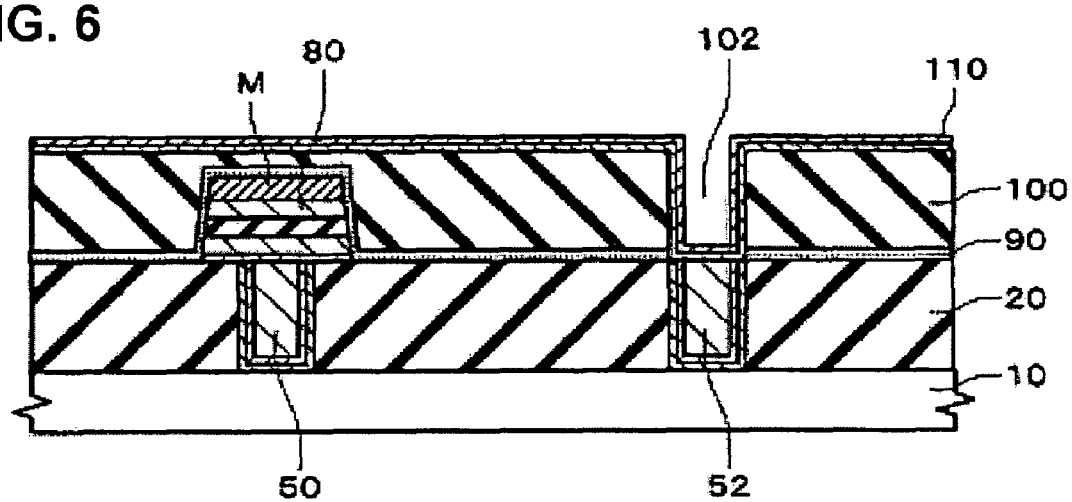
FIG. 6 is a view showing the method for manufacturing a ferroelectric memory in accordance with the embodiment of the present invention.
Figure 7:
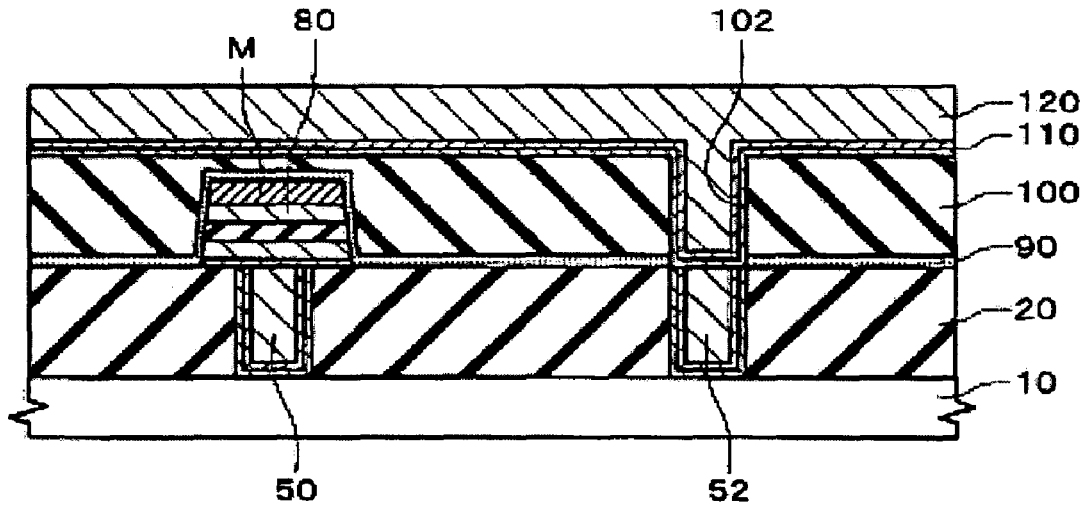
FIG. 7 is a view showing the method for manufacturing a ferroelectric memory in accordance with the embodiment of the present invention.

As shown in FIG. 6, a second dielectric layer 100 that covers the hard mask M, the ferroelectric capacitor 80 and the second contact section 52 on the first dielectric layer 20. When the hydrogen barrier layer 90 is formed, the second dielectric layer 100 is formed on the hydrogen barrier layer 90.

Next, a third contact hole 102 is formed in the second dielectric layer 100. The third contact hole 102 is formed above the second contact section 52, in a manner that at least a portion of the upper surface of the second contact section 52 is exposed. For this reason, the second dielectric layer 100 and the hydrogen barrier layer 90 are removed by dry etching. However, the hard mask M and the ferroelectric capacitor 80 are kept in a state covered by the second dielectric layer 100, so as not to be exposed externally. For example, a portion of the second dielectric layer 100 may be left remained on the hard mask M by a thickness of about several Angstroms. Then, in order to form a third contact section 130, a barrier layer 110 is formed on inner surfaces of the third contact hole 102 (see FIG. 6), and a second conductive layer 120 is formed in a manner to embed the interior of the third contact hole 102 (see FIG. 7). The details of the barrier layer 30 and the first conductive layer 40 described above apply to the details of the barrier layer 110 and the second conductive layer 120, respectively.

According to the present embodiment, when the step of forming the third contact section 130 (for example, the step of forming the second conductive layer 140 (for example, a tungsten layer) is accompanied with a treatment with hydrogen, because the ferroelectric capacitor 80 is in a state covered by the second dielectric layer 100, the ferroelectric capacitor 80 can be prevented from being reduced by hydrogen, and therefore deterioration of its characteristics can be prevented. Also, in accordance with the present embodiment, for example, the upper electrode 86 does not need to be formed thick enough to the extent of achieving a hydrogen barrier effect, and therefore a method for manufacturing a ferroelectric capacitor that complies with its miniaturization can be realized without concern about the influence of hydrogen.

Figure 8:
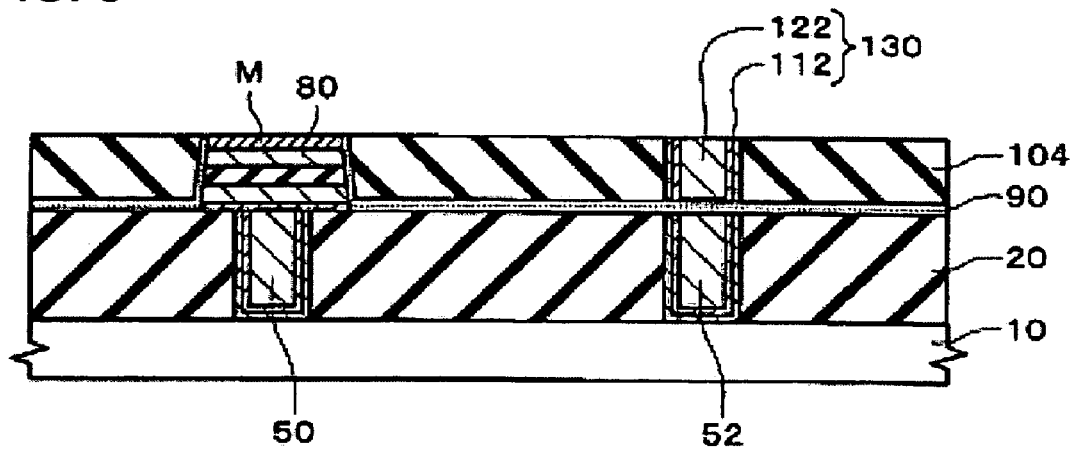
FIG. 8 is a view showing the method for manufacturing a ferroelectric memory in accordance with the embodiment of the present invention.

Then, as shown in FIG. 8, the second conductive layer 120 and the second dielectric layer 100 are polished until the hard mask M on the ferroelectric capacitor 80 is exposed. Also, by conducting the polishing step, a third contact section 130 can be formed. The third contact section 130 includes a barrier layer 112 formed along an inner surface of the third contact hole 102 and a conductive section 122 formed on the inside surrounded by the barrier layer 112.

In the polishing step, the working surface is polished flat. For example, the polishing may be conducted by a CMP method. In the polishing step, first, the second conductive layer 120 is polished, and then the barrier layer 110 and the second dielectric layer 100 are successively polished. Then, the hydrogen barrier layer 90 on the ferroelectric capacitor 80 is also polished, and the hard mask M on the ferroelectric capacitor 80 is finally exposed. In this case, the polishing may be conducted until a portion of the hard mask M is removed. In other words, by removing a portion including the top surface of the hard mask M, a new surface of the hard mask M may be exposed. By this, a margin according to the thickness of the hard mask M is secured, such that the manufacturing process can be facilitated. Also, by leaving a portion of the hard mask M remained on the ferroelectric capacitor 80, the upper electrode 86 of the ferroelectric capacitor 80 would not be polished, and in this respect, deterioration of the characteristics of the ferroelectric capacitor 80 can be prevented. Also, even when the upper surface of the hard mask M is oxidized in an anneal treatment or the like, the upper surface can be removed, and a new surface that is not oxidized can be exposed, such that the reliability in electrical connection can be improved.

It is noted that, as a modified example, the polishing may be stopped before the hard mask M is polished. In this case, the upper surface of the hard mask M is exposed.

According to the present embodiment, the hard mask M on the ferroelectric capacitor 80 is exposed by polishing. In other words, because there is no need to form a contact hole over the ferroelectric capacitor 80 by using, for example, dry etching, the manufacturing method can be simplified, and deterioration of the characteristics of the ferroelectric capacitor 80 by etching damage (for example, plasma damage) can be prevented.

It is noted that the hard mask M after polishing can be left without being removed. By this, there is no need to provide a step of removing the hard mask M again after polishing, such that the manufacturing process can be facilitated and simplified. It is noted that, because the hard mask M is conductive, the electrical conductivity of the ferroelectric capacitor 80 would not be prevented.

As shown in FIG. 8, the upper surface of the second dielectric layer 104 after the polishing step has been completed is positioned generally at the same height with the upper surface (for example, a surface newly exposed after polishing) of the hard mask M on the ferroelectric capacitor 80. More particularly, the upper surface of the hard mask M and the upper surface of the second dielectric layer 104 may be positioned at the same height, or may be positioned substantially at the same height within an error range of polishing accuracy. Similarly, the upper surface of the third contact section 130 may also be positioned generally at the same height with the upper surface of the hard mask M. In other words, in the present embodiment, the upper surface of the hard mask M over the ferroelectric capacitor 80, the upper surface of the second dielectric layer 104 and the upper surface of the third contact section 130 are at the same height.

Figure 9:
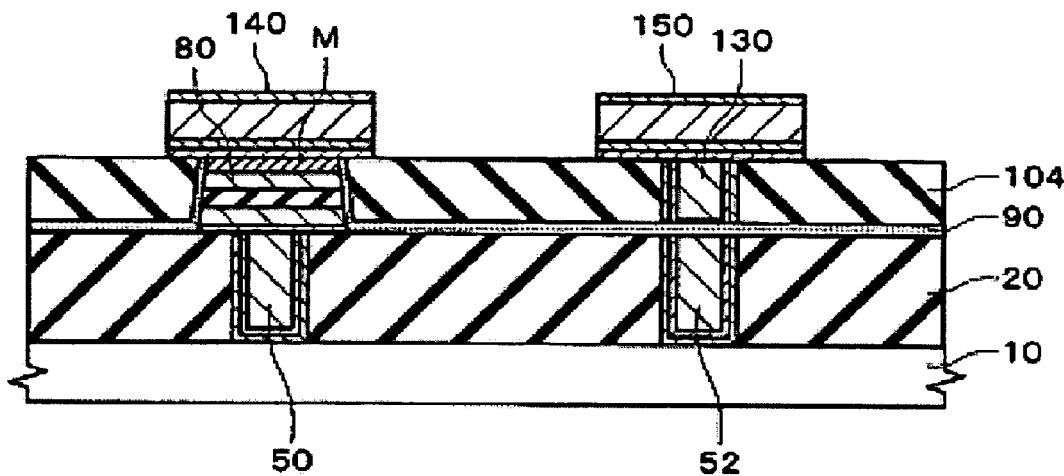
FIG. 9 is a view showing the method for manufacturing a ferroelectric memory in accordance with the embodiment of the present invention.
Figure 10:
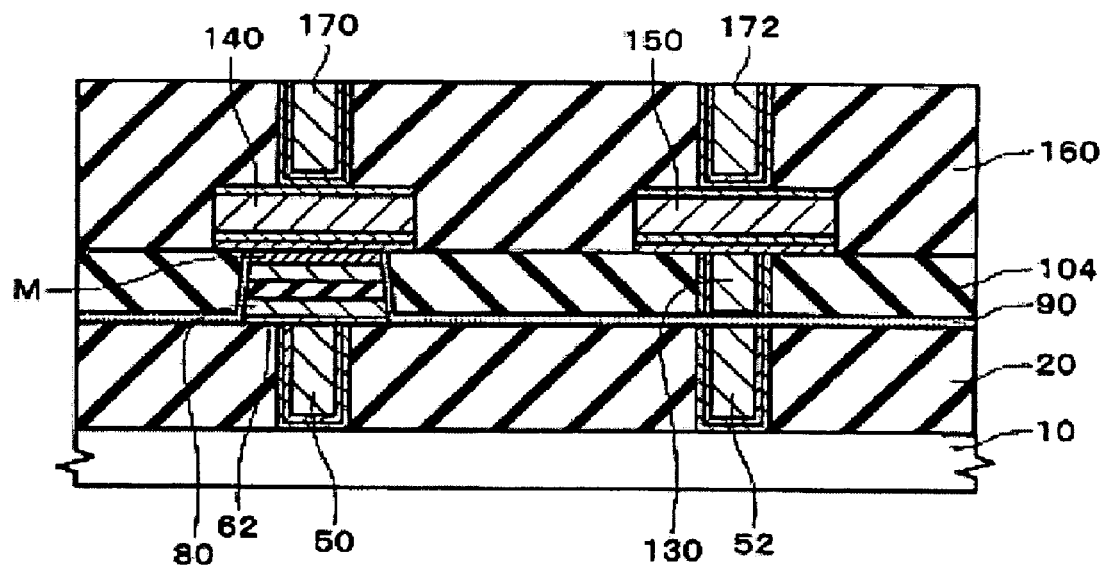
FIG. 10 is a view showing the method for manufacturing a ferroelectric memory in accordance with the embodiment of the present invention.

Next, as shown in FIG. 9, an electrical connection section 140 is formed on the hard mask M. The electrical connection section 140 may be formed from a metal that is used for electrode pads of a semiconductor chip (for example, an aluminum layer (Al layer)) or a copper layer (Cu layer). The electrical connection section 140 may be formed in multiple layers, and may be formed by, for example, successively laminating, on the hard mask M, a Ti layer, a TiN layer, an Al layer (or a Cu layer) and a TiN layer. The electrical connection section 140 is formed through forming a film over the entire surface of the second dielectric layer 104 by a sputtering method, and patterning the film in a predetermined configuration by a combination of a photolithography technique and an etching technique. When an electrical connection section 150 is formed on the third contact section 130, the electrical connection sections 140 and 150 may be concurrently patterned and formed. The electrical connection sections 140 and 150 may be formed as contact sections for electrical connection in a vertical direction. In this case, the plane configuration of the electrical connection sections 140 and 150 may have identical or similar shapes as that of the other contact sections, and for example, may be in a polygonal shape (for example, a square shape) or a circular shape. Alternatively, the electrical connection sections 140 and 150 may be formed as wiring patterns for electrically connecting multiple points at different locations in a plane. It is noted that the electrical connection section 140 may be formed in a region including the hard mask M (ferroelectric capacitor 80) (for example, on the hard mask M and its surrounding area on the second dielectric layer 104). Further, the electrical connection section 150 may be formed in a region including the third contact section 130 (for example, on the third contact section 130 and its surrounding area on the second dielectric layer 104).

According to the present embodiment, because the electrical connection sections 140 and 150 are formed on a flat surface to which the polishing step has been applied, the flatness of the electrical connection sections 140 and 150 can be secured, and a manufacturing method that complies with multilayering can be realized.

Thereafter, according to the requirements, contact sections that electrically connect to the electrical connection sections 140 and 150 are formed. In the example shown in FIG. 10, a third dielectric layer 160 that covers the electrical connection sections 140 and 150 is formed over the second dielectric layer 104, and fourth and fifth contact sections 170 and 172 are formed in the third dielectric layer 160. More specifically, the fourth contact section 170 is formed over the electrical connection section, and the fifth contact section 172 is formed over the electrical connection section 150. Details of the third dielectric layer 160, and the fourth and fifth contact sections 170 and 172 can be derived from the contents described above, and therefore its description is omitted. It is noted that other contact sections and dielectric layers (not shown) may be formed over the fourth and fifth contact sections 170 and 172 to achieve further multilayering. Also, at the uppermost section thereof, electrode pads, passivation and the like (not shown) are formed.

By the method for manufacturing a ferroelectric capacitor in accordance with the present embodiment, there can be provided a manufacturing method that can prevent deterioration of the characteristics of the ferroelectric capacitor 80, as described above, and that can realize further miniaturization and multilayering in ferroelectric memories.

A ferroelectric memory in accordance with the present embodiment includes the base substrate 10, the first and second dielectric layers 20 and 104, the first through third contact sections 50, 52 and 130, the ferroelectric capacitor 80, and the conductive hard mask M. The first and second contact sections 50 and 52 are formed in the first dielectric layer 20 on the lower layer side, and the ferroelectric capacitor 80 and the third contact section 130 are formed in the second dielectric layer 104 on the upper layer side. The hard mask M is formed over the ferroelectric capacitor 80. The ferroelectric capacitor 80 is formed above the first contact section 50, and the third contact section 130 is formed above the second contact section 52. Further, the upper surface of the second dielectric layer 104 is positioned generally at the same height with the upper surface of the hard mask M. Also, the upper surface of the third contact section 130 is positioned generally at the same height with the upper surface of the hard mask M. By this, the flatness of the electrical connection section 140 formed on the hard mask M and the electrical connection section 150 formed on the third contact section 130 can be secured. When the electrical connection section 140 (the electrical connection section 150) is flat, the fourth contact section 170 (the fifth contact section 172) can be freely formed at any position in a plane (for example, at a position where it overlaps the ferroelectric capacitor 80), compared to the case where there are recesses and protrusions according to the configuration of contact holes, such that the degree of freedom in manufacturing can be considerably improved according to the miniaturization and multilayering.

It is noted that other details of the ferroelectric memory include contents that can be derived from the manufacturing method described above, and deterioration of the characteristics of the ferroelectric capacitor can be prevented, and further miniaturization and more layers can be achieved in ferroelectric memories.

The present invention is not limited to the embodiments described above, and many modifications can be made. For example, the present invention may include compositions that are substantially the same as the compositions described in the embodiments (for example, a composition with the same function, method and result, or a composition with the same objects and results). Also, the present invention includes compositions in which portions not essential in the compositions described in the embodiments are replaced with others. Also, the present invention includes compositions that achieve the same functions and effects or achieve the same objects of those of the compositions described in the embodiments. Furthermore, the present invention includes compositions that include publicly known technology added to the compositions described in the embodiments.

What is claimed is:

1. A method for manufacturing a ferroelectric memory comprising:
   (a) forming first and second contact sections on a first dielectric layer formed above a base substrate;
   (b) forming a laminated body having a lower electrode, a ferroelectric layer and an upper electrode successively laminated;
   (c) forming a conductive hard mask above the laminated body and etching an area of the laminated body exposed through the hard mask, to thereby form a ferroelectric capacitor above the first contact section;
   (d) forming above the first dielectric layer a second dielectric layer that covers the hard mask, the ferroelectric capacitor and the second contact section;
   (e) forming a contact hole in the second dielectric layer which exposes the second contact section;
   (f) providing a conductive layer in an area including the contact hole for forming a third contact section; and
   (g) polishing the conductive layer and the second dielectric layer until the hard mask above the ferroelectric capacitor is exposed.

2. In the method for manufacturing a ferroelectric memory according to claim 1, the method for manufacturing a ferroelectric memory wherein, in the step (g), a portion of the hard mask is removed.

3. In the method for manufacturing a ferroelectric memory according to claim 1, the method for manufacturing a ferroelectric memory wherein, in the step (g), the polishing is conducted by using a CMP (Chemical Mechanical Polishing) method.

4. In the method for manufacturing a ferroelectric memory according to claim 1, the method for manufacturing a ferroelectric memory further comprising, after the step (g), forming an electrical connection section above the hard mask.

5. In the method for manufacturing a ferroelectric memory according to claim 4, the method for manufacturing a ferroelectric memory wherein the electrical connection section is formed as a contact section.

6. In the method for manufacturing a ferroelectric memory according to claim 5, the method for manufacturing a ferroelectric memory further comprising, after the step (g), forming another electrical connection section above the third contact section.

7. In the method for manufacturing a ferroelectric memory according to claim 4, the method for manufacturing a ferroelectric memory wherein the electrical connection section is formed as a wiring pattern.

8. In the method for manufacturing a ferroelectric memory according to claim 7, the method for manufacturing a ferroelectric memory further comprising, after the step (g), forming another electrical connection section above the third contact section.

9. In the method for manufacturing a ferroelectric memory according to claim 4, the method for manufacturing a ferroelectric memory further comprising, after the step (g), forming another electrical connection section above the third contact section.

10. In the method for manufacturing a ferroelectric memory according to claim 1, the method for manufacturing a ferroelectric memory wherein the hard mask includes a Ti Al N layer.

11. In the method for manufacturing a ferroelectric memory according to claim 1, the method for manufacturing a ferroelectric memory further comprising, after the step (c), forming a hydrogen barrier layer that covers at least the hard mask and the ferroelectric capacitor.

12. A ferroelectric memory comprising:
   a base substrate;
   a first dielectric layer formed above the base substrate;
   first and second contact sections on the first dielectric layer;

a ferroelectric capacitor formed from a lower electrode, a ferroelectric layer and an upper electrode successively laminated above the first contact section;

a conductive hard mask formed above the ferroelectric capacitor;

a second dielectric layer that is formed above the first dielectric layer, and has an upper surface that is generally at an identical height with an upper surface of the hard mask above the ferroelectric capacitor;

a third contact section formed on the second dielectric layer and positioned above the second contact section; and an electrical connection section formed above the hard mask.

13. In the ferroelectric capacitor according to claim 12, the ferroelectric memory wherein an upper surface of the third contact section is positioned generally at an identical height with the upper surface of the hard mask above the ferroelectric capacitor.

* * * * *